(12) United States Patent
Lee et al.

(10) Patent No.: US 8,300,445 B2
(45) Date of Patent: Oct. 30, 2012

(54) NANOWIRE AND MEMORY DEVICE USING IT AS A MEDIUM FOR CURRENT-INDUCED DOMAIN WALL DISPLACEMENT

(75) Inventors: Kyung-Jin Lee, Seoul (KR); Hyun-Woo Lee, Gyeongsangbuk-do (KR); Soon-Wook Jung, Gyeongsangbuk-do (KR)

(73) Assignees: Korea University Industrial & Academic Collaboration Foundation, Seoul (KR); Postech Academy-Industry Foundation, Gyeongsangbuk-do (KR)

( * ) Notice: Subject to any disclaimer, the term of this patent is extended or adjusted under 35 U.S.C. 154(b) by 127 days.

(21) Appl. No.: 12/746,473

(22) PCT Filed: Dec. 4, 2008

(86) PCT No.: PCT/KR2008/007165
§ 371 (c)(1),
(2), (4) Date: Sep. 7, 2010

(87) PCT Pub. No.: WO2009/072819
PCT Pub. Date: Jun. 11, 2009

(65) Prior Publication Data
US 2011/0007559 A1    Jan. 13, 2011

(30) Foreign Application Priority Data
Dec. 6, 2007  (KR) .................. 10-2007-0126001

(51) Int. Cl.
*G11C 19/00*    (2006.01)

(52) U.S. Cl. .......... 365/81; 365/148; 365/158; 365/171; 977/933

(58) Field of Classification Search .............. 365/48, 365/66, 80–85, 100, 148, 158, 171, 173, 365/225.5, 243.5; 257/421, E21.665; 438/3; 977/933–935
See application file for complete search history.

(56) References Cited

U.S. PATENT DOCUMENTS

| 7,031,178 | B2 | 4/2006 | Parkin |
| 2005/0078511 | A1 | 4/2005 | Parkin |
| 2008/0253161 | A1* | 10/2008 | Parkin et al. .......... 365/80 |

FOREIGN PATENT DOCUMENTS

| JP | 2006-005308 | 1/2006 |
| JP | 2006-196708 | 7/2006 |

OTHER PUBLICATIONS

International Search Report for International Application No. PCT/KR2008/007165.
Written Opinion of the International Searching Authority for International Application No. PCT/KR2008/007165.

* cited by examiner

*Primary Examiner* — Alexander Sofocleous
*Assistant Examiner* — Harry W Byrne
(74) *Attorney, Agent, or Firm* — Alston & Bird LLP

(57) ABSTRACT

Disclosed herein are a nanowire and a current-induced domain wall displacement-type memory device using the same. The nanowire has perpendicular magnetic anisotropy and is configured in a manner that when a parameter Q, calculated by a saturation magnetization per unit area, a domain wall thickness and a spin polarizability of a ferromagnet that is a constituent material of the nanowire, has a value of (formula 1 should be inserted here) a domain wall thickness, a width "*" and a thickness –* of the nanowire satisfy the relationship of (formula 2 should be inserted here) The present invention can be designed such that a current density capable of driving a memory device utilizing the current-driven domain wall displacement has a value of less than (formula 3 should be inserted here), through the determination of the optimal nanowire width and thickness satisfying a value of a critical current density, Jc for the domain wall displacement below a certain value required for commercialization, for a given material in the nanowire with perpendicular anisotropy. According to such a configuration of the present invention, the current density required for the domain wall displacement can be at least 10 times or further lowered than the current density in currently available nano wires. Therefore, the present invention is capable of solving the problems associated with high power consumption and malfunction of the device due to generation of Joule heat and is also capable of achieving low-cost production of memory devices.

$$3 \times 10^8 \text{ A/cm}^2 \le Q \le 10^9 \text{ A/cm}^2, \tag{1}$$

$$\frac{1.39}{\sqrt{T/\lambda}} + 4.51 \le \frac{W}{\lambda} \le \frac{1.53}{\sqrt{T/\lambda}} + 4.44 \tag{2}$$

$$10^7 \text{ A/cm}^2, \tag{3}$$

4 Claims, 9 Drawing Sheets

[Figure 1]
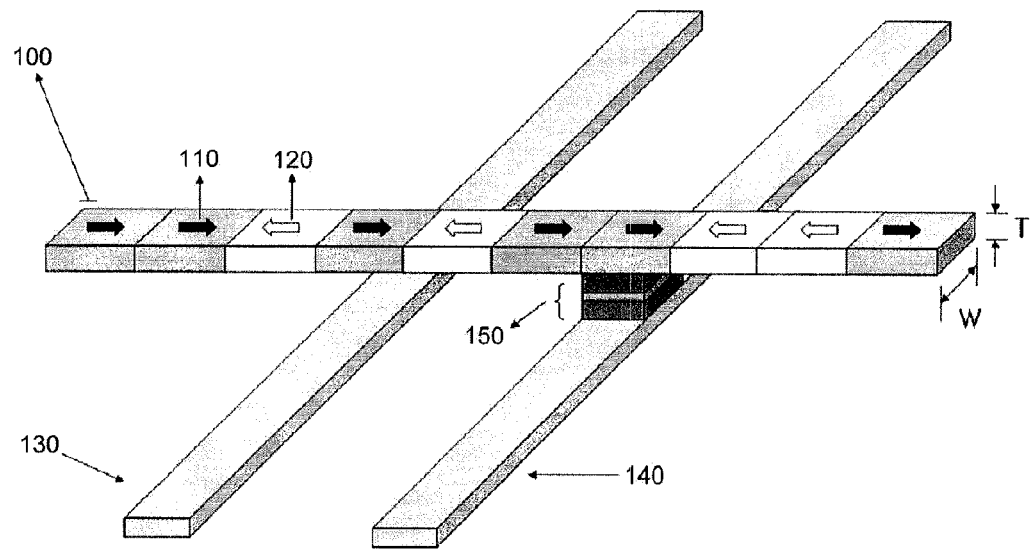
[Figure 2]
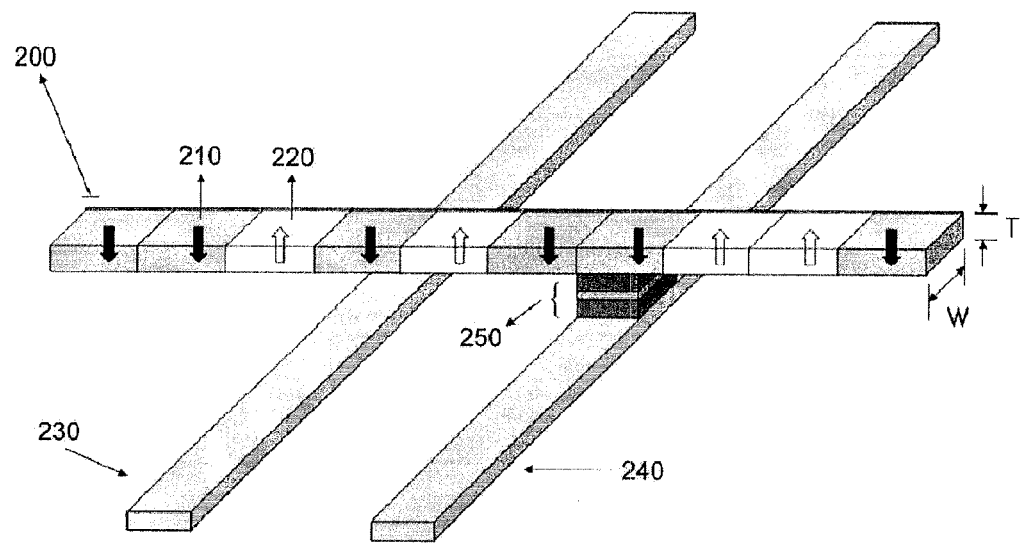

[Figure 3a]
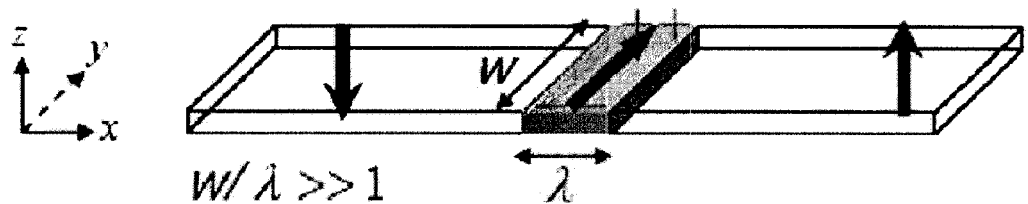
[Figure 3b]
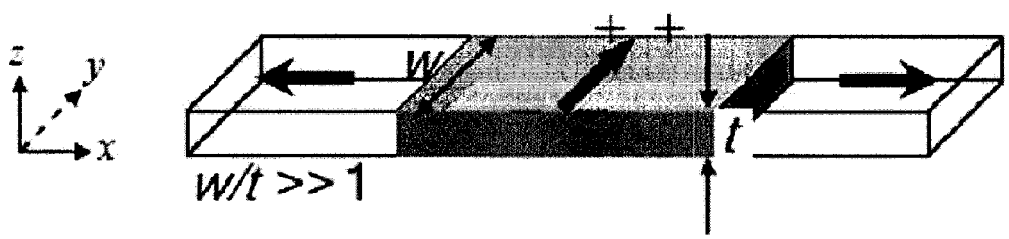
[Figure 3c]
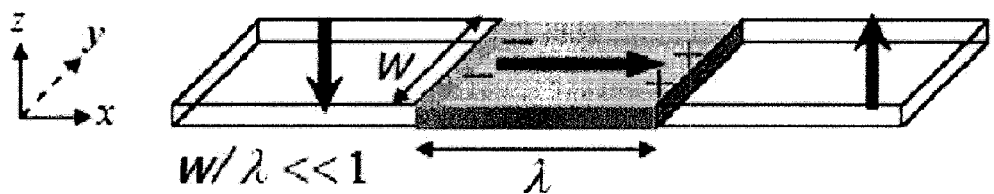
[Figure 3d]
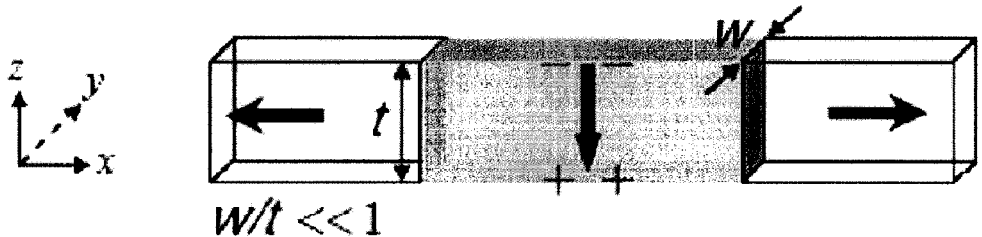

[Figure 4a]
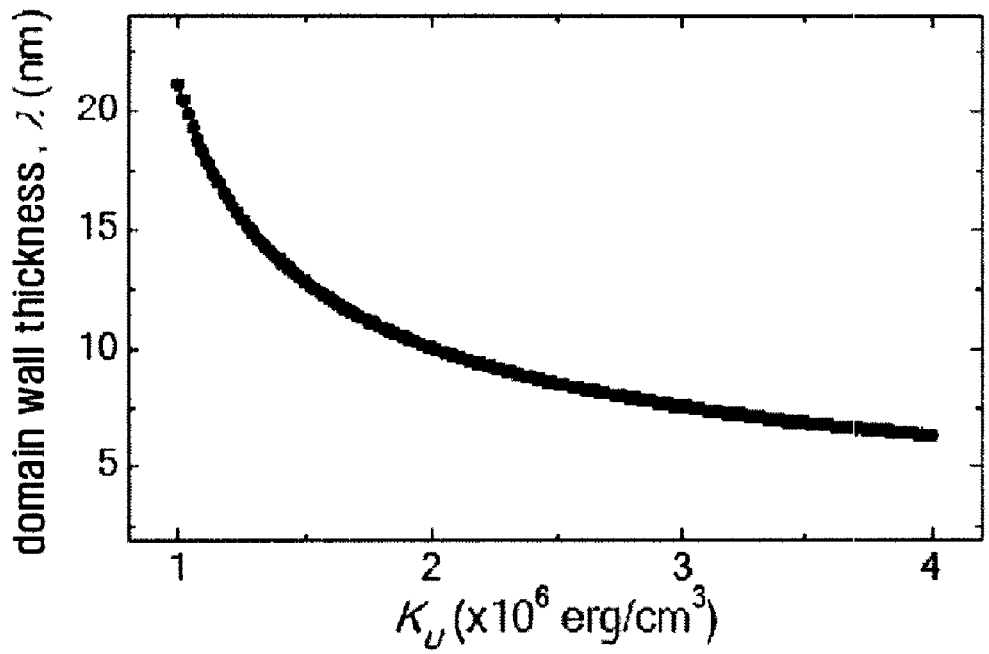
[Figure 4b]
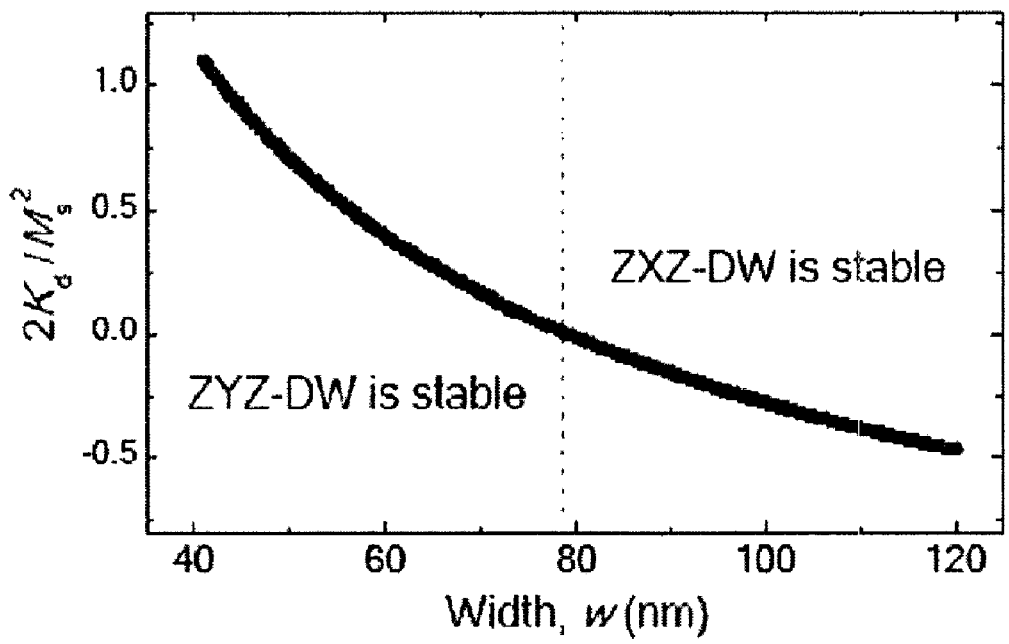

[Figure 5]
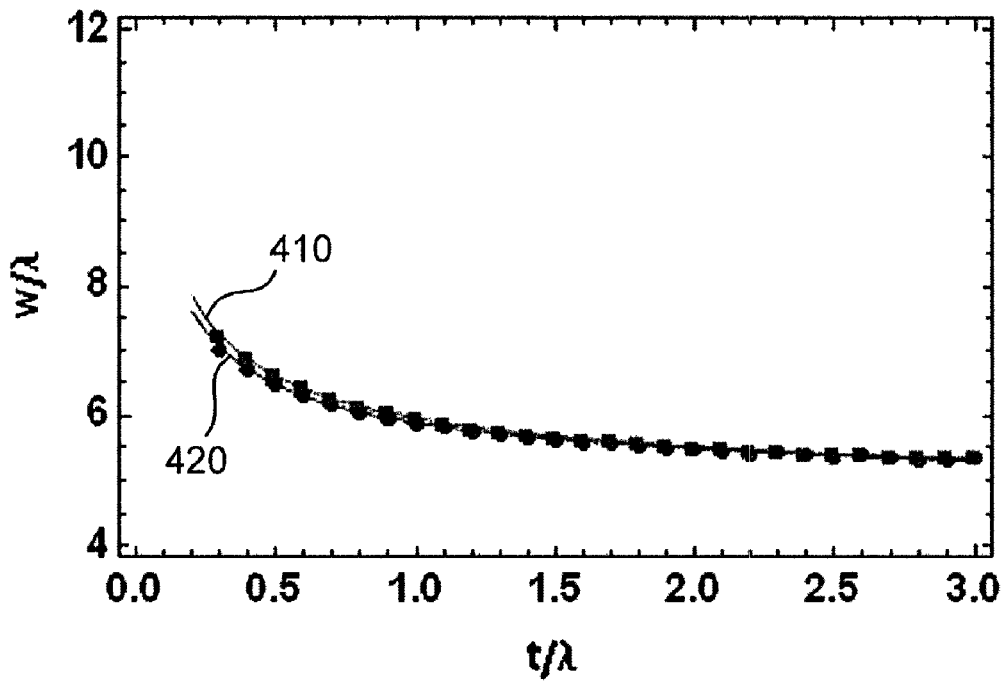
[Figure 6]
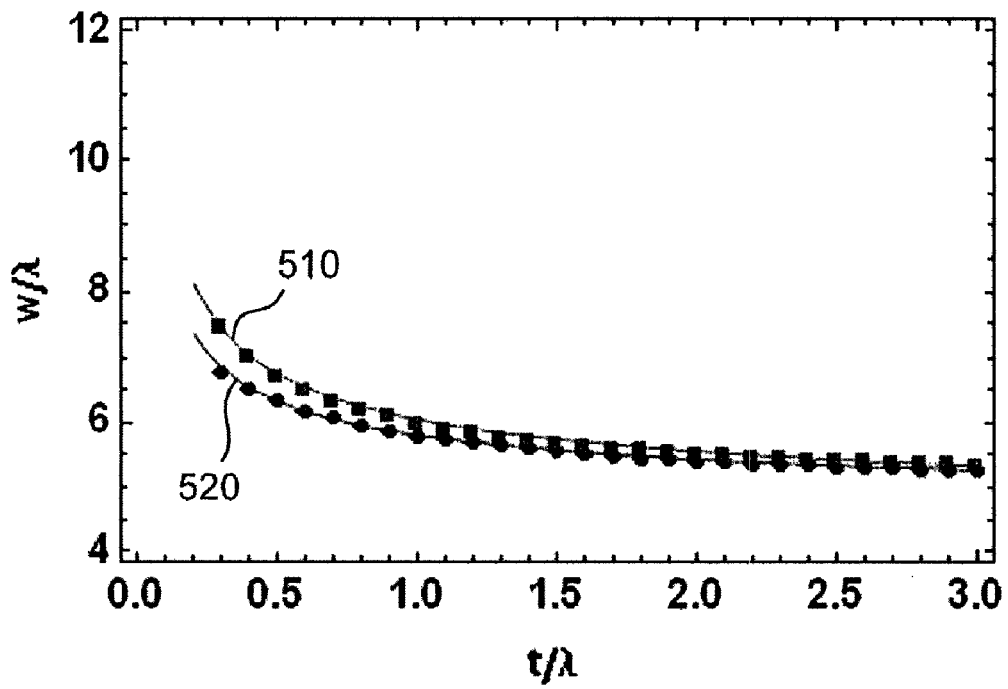

【Figure 7】
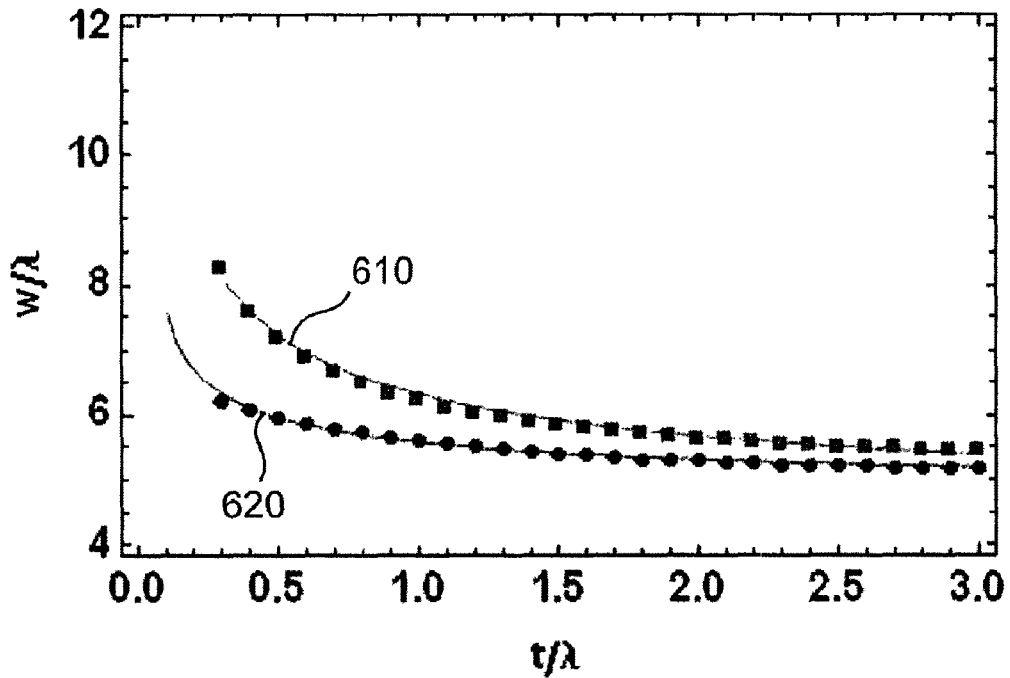
【Figure 8】
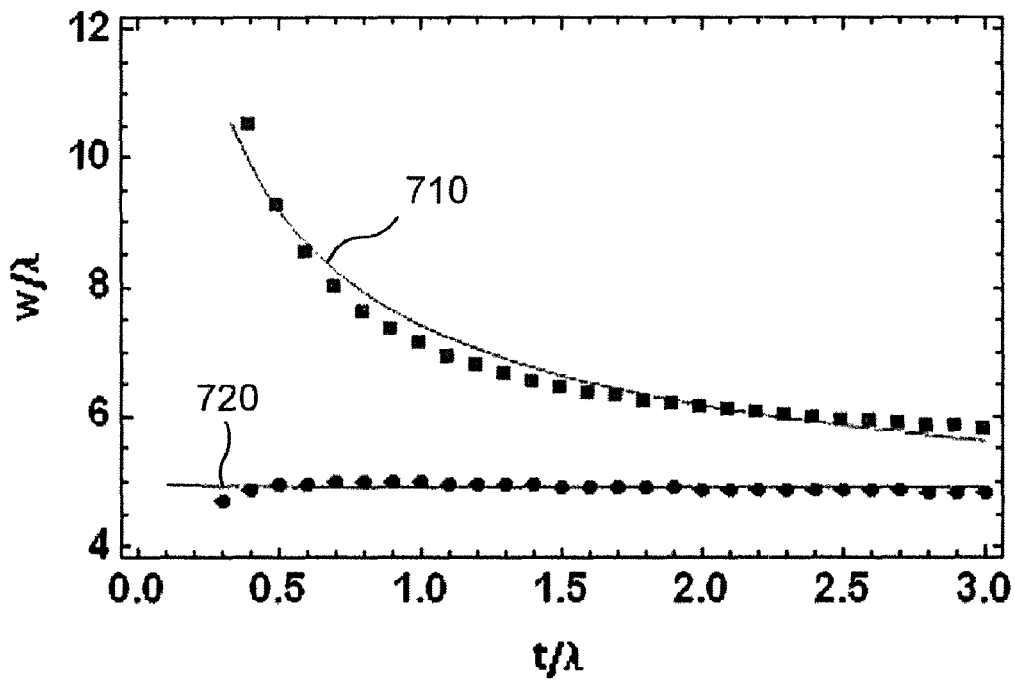

[Figure 9]
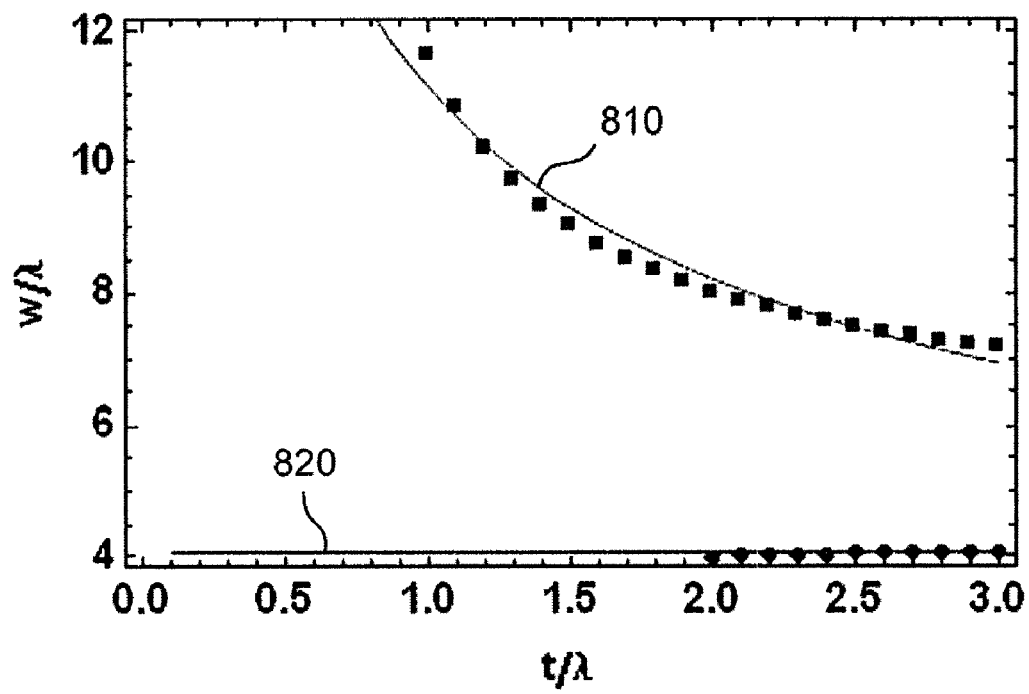
[Figure 10]
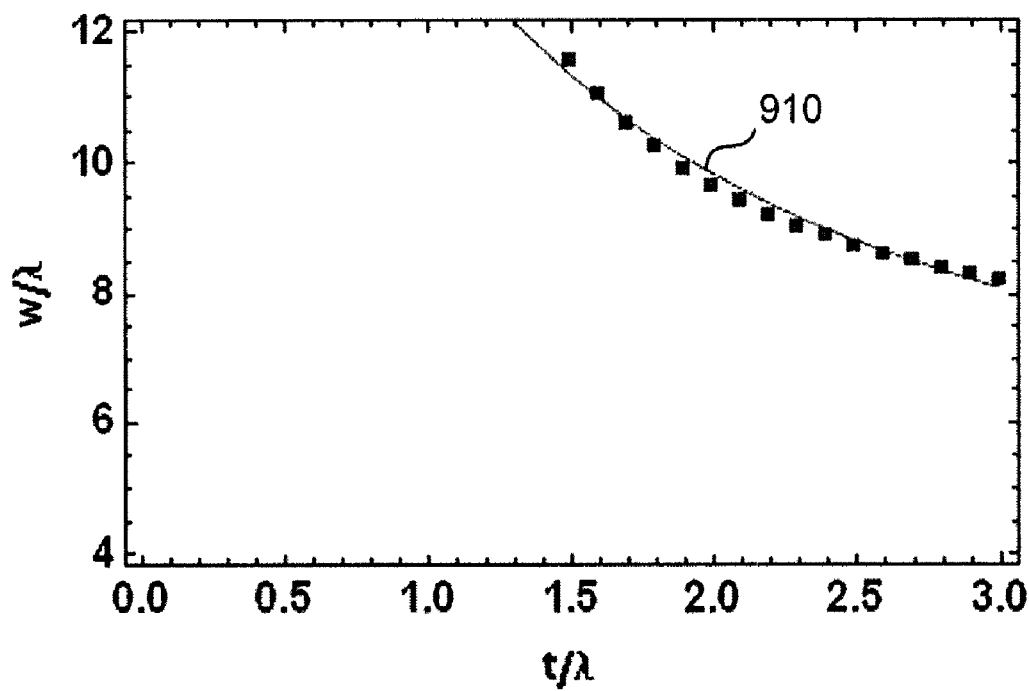

[Figure 11a]
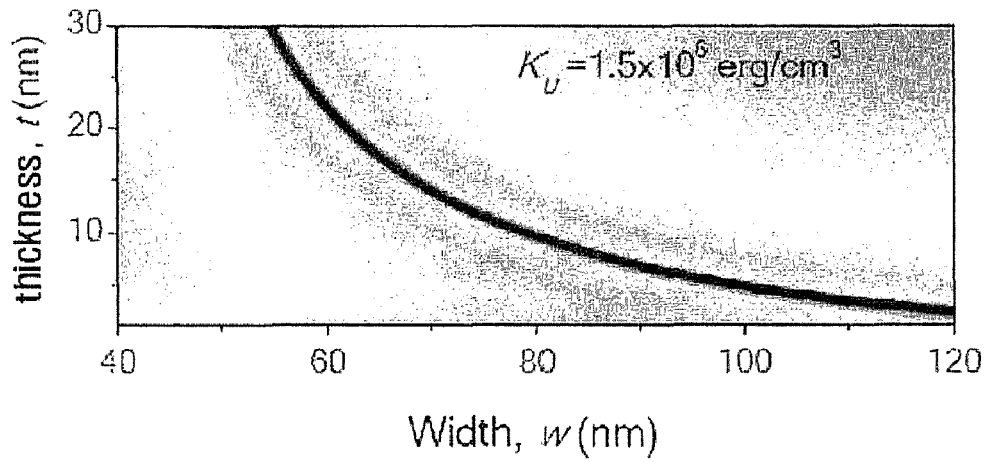
[Figure 11b]
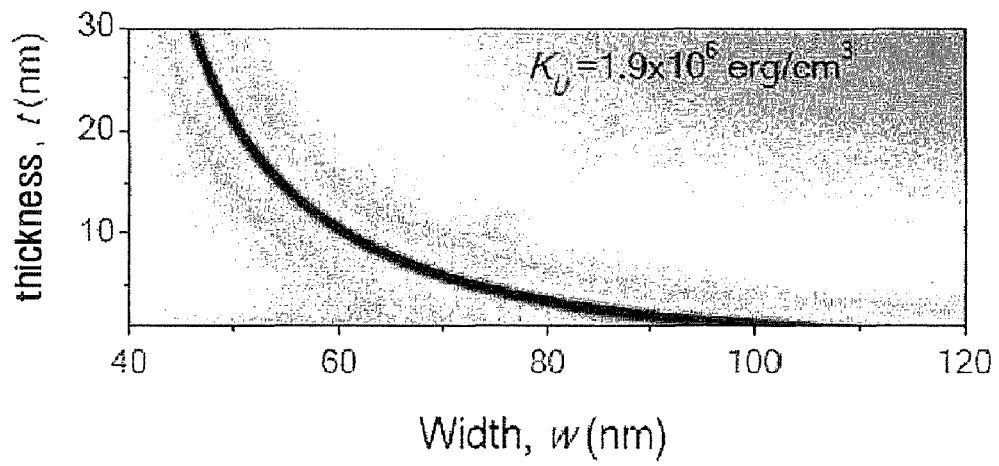
[Figure 11c]
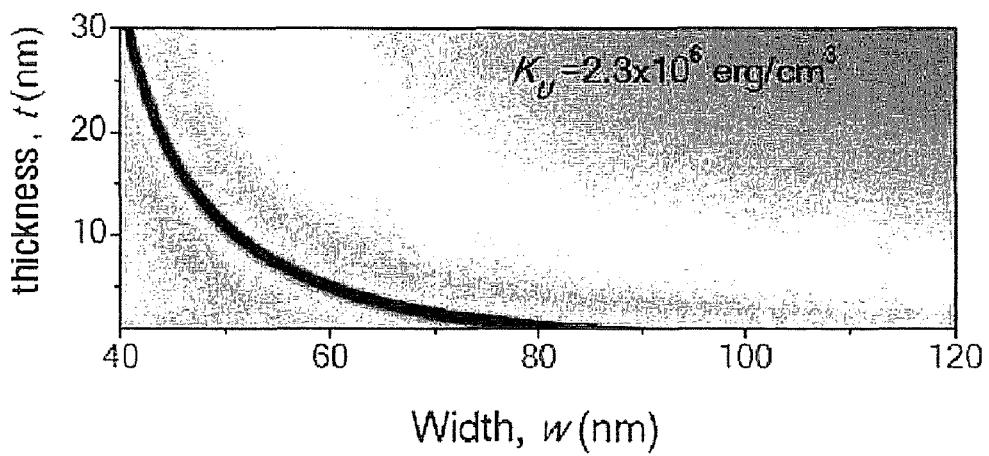

[Figure 12]
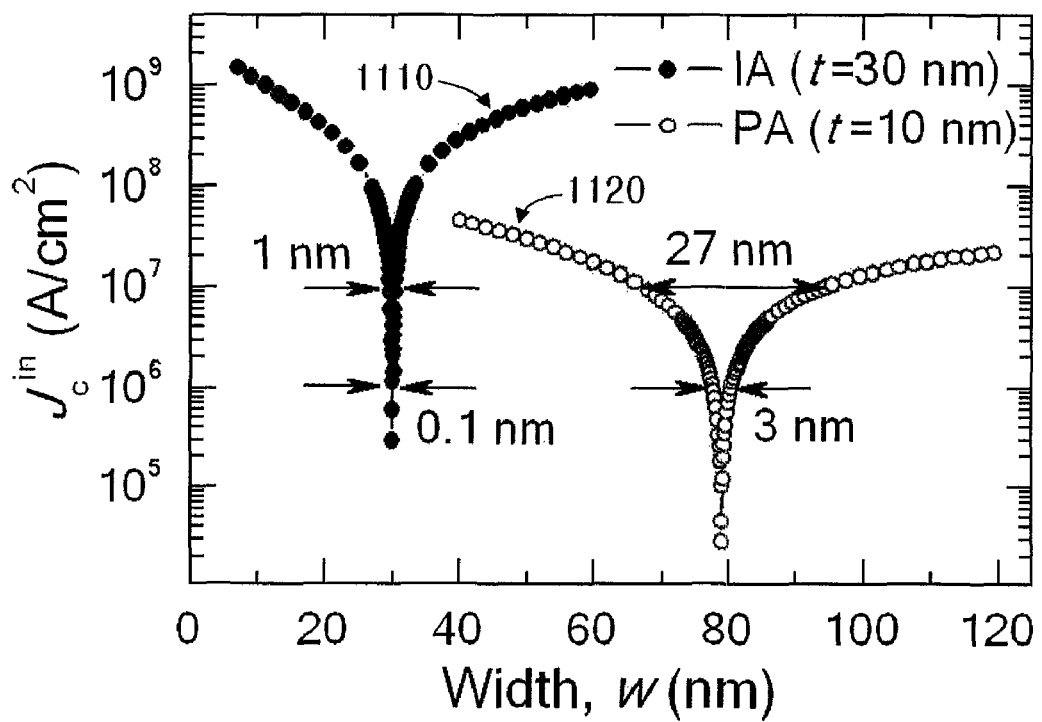

[Figure 13a]
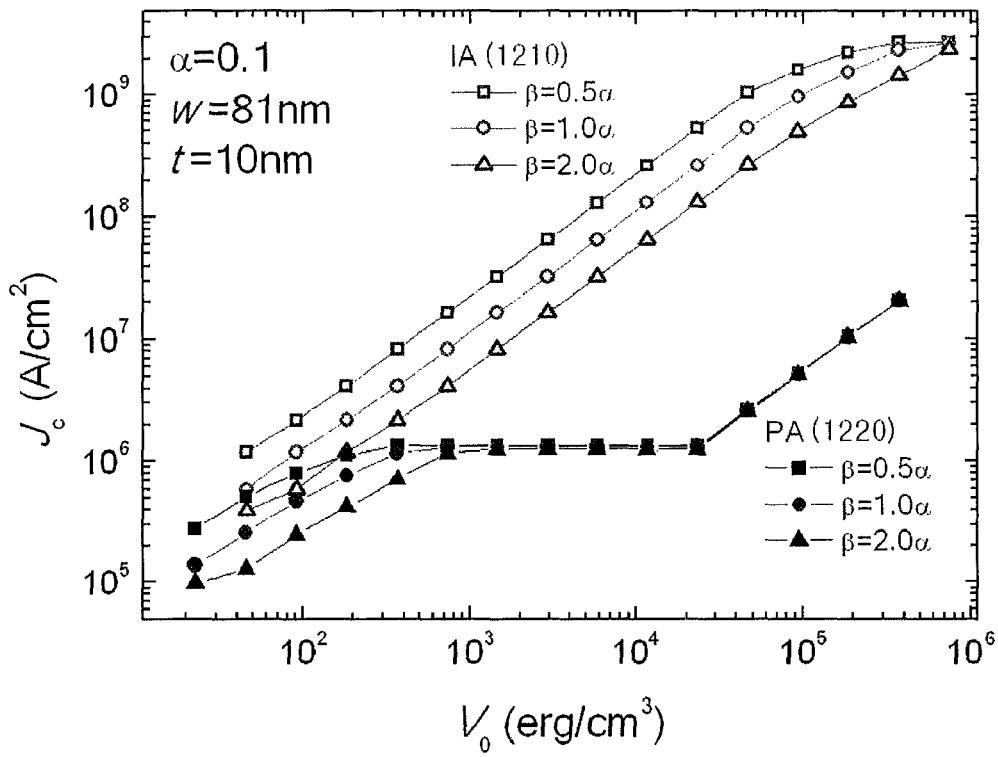
[Figure 13b]
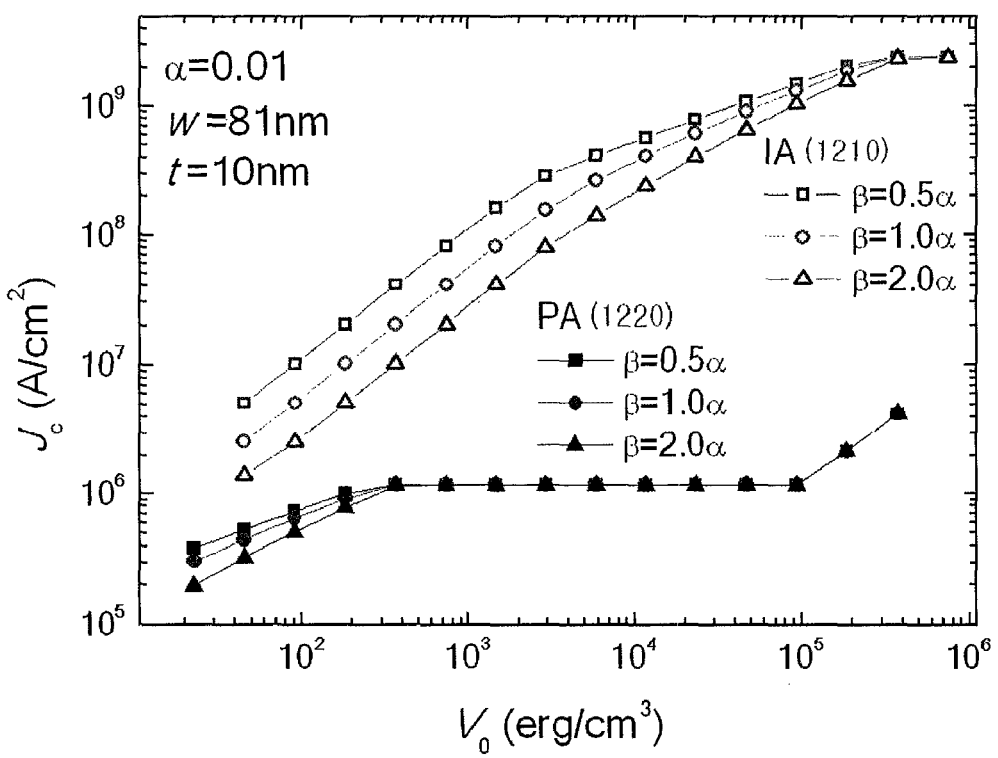

NANOWIRE AND MEMORY DEVICE USING IT AS A MEDIUM FOR CURRENT-INDUCED DOMAIN WALL DISPLACEMENT

TECHNICAL FIELD

The present invention relates to a nanowire. More specifically, the present invention relates to a nanowire which enables the construction of a memory device at a low current density by the application of an electric current to a ferromagnetic nanowire to induce the domain wall displacement and a current-induced domain wall displacement-type memory device using the same.

BACKGROUND ART

Ferromagnets refer to magnetic materials that become strongly magnetized in a magnetic field direction when exposed to an external strong magnetic field and retain their magnetism even when the external magnetic field is removed. In this case, individual atoms of the magnetic material behave like individual magnets.

That is, the ferromagnet is a material having magnet-like properties and typically includes iron, cobalt, nickel and their alloys. Individual atoms in the ferromagnetic material serve as individual magnets. The magnetic moments of these atoms are relatively less regularly aligned when they are not exposed to an external magnetic field, thus generally providing no magnet-like effects. However, when a magnet is brought close to the material, those atoms tend to align their magnetic moments with the external magnetic field and are therefore attracted to the magnet. Such regular alignment of atoms in a given direction under the influence of an external magnetic field is called "magnetization", and the magnetized material per se can attract other ferromagnetic materials, as does a magnet.

As is known in the related art, the spins of electrons in the ferromagnet are aligned parallel to one another in the same direction, so magnetic moments responsible for magnetization form and increase. Further, magnetic domains are considered as large groups of atoms whose spins are aligned parallel with one another. Within the magnetic field, the magnetic domains whose spins are aligned with a magnetic field direction are produced or enlarged. Even after the externally applied magnetic field is removed, the spins of atoms are still aligned in the same direction for a long period of time, consequently resulting in appearance of remanent magnetization. When a temperature is elevated, thermal motion of atoms takes place in the ferromagnet, which breaks up regular arrangement of atom spins, thus becoming paramagnetic with loss of ferromagnetism. This temperature is called the Curie temperature above which a ferromagnetic material loses its ferromagnetism and becomes paramagnetic. This phenomenon is exploited in a variety of applications such as permanent magnets, magnetic permeability materials, and magnetostrictive materials.

Recently, IBM has proposed a new type of memory device, which consists of ferromagnetic nanowires and whose operation is based on the ferromagnetic domain wall displacement caused by the current injected into the magnetic nanowire.

FIG. 1 shows a conventional ferromagnetic nanowire-based memory device.

As FIG. 1 illustrates, magnetization directions of magnetic domains 110,120 whose magnetization directions are different from each other and are parallel to the nanowire surface are recorded in a conventional ferromagnetic nanowire 100, and the magnetic domains 110,120 are then moved by means of a current-induced domain wall displacement phenomenon where positional displacement of domain walls takes place upon application of an electric current to the nanowire.

As can be seen from FIG. 1, the conventional ferromagnetic nanowire 100 has a width (W) of from several to several hundreds of nm and a thickness (T) of from several to several hundreds of nm.

The information of the magnetic domains in the nanowire can be recorded and reproduced by recording and reproduction devices 130,140,150 positioned adjacent to the nanowire. Advantages of this technique are in that the positions of information recording and reproduction devices are fixed and the positions of information-containing magnetic domains can be electrically moved.

In spite of advantages such as a high recording density and non-volatility of information, conventional hard discs suffer from problems of impact susceptibility arising from a mechanically moving head of the device and also from high power consumption, which have been obstacles to the practical application of such hard discs to mobile storage devices.

On the other hand, flash memories, which are widely used as mobile storage devices, require very expensive production processes since one CMOS transistor should be inserted for each storage unit.

In contrast, the current-induced domain wall displacement-type memory device, to which the present invention pertains, is a storage device which is significantly advantageous as will be explained in the following. Specifically, the problems associated with high costs of flash memories can be solved because the memory device in accordance with the present invention requires only one CMOS transistor per nanowire where several tens to several hundreds of bits are stored. Further, as the mechanical rotational motion providing an important role in operation of the hard disc is replaced with the domain wall displacement which involves no mechanical motion, it is possible to achieve high impact resistance and low power consumption while retaining advantages of conventional hard discs, i.e. high storage density and non-volatility of recorded information.

In other words, the device of the present invention is significantly attractive as a memory device that provides prominent strengths of the hard disc (including high storage density and non-volatility of recorded information) simultaneously with high impact resistance and low power consumption, through the replacement of a mechanical element with an electrical element.

The most important factor in this technique is a current-induced domain wall displacement phenomenon, which was first theoretically proposed in 1980's by L. Berger and was recently experimentally observed by Yamaguchi, Klaui, Parkin and many other research groups.

According to the experimental research results reported up to date, a critical current density for the domain wall displacement using an electric current alone without the application of a magnetic field is about $10^8$ A/cm$^2$, which is 10 to 100 times greater than a value of $10^7$ A/cm$^2$ required for commercial application.

Increases in the critical current density disadvantageously result in very high power consumption for application of an electric current, and incapability to control the domain wall displacement due to generation of Joule heat.

DISCLOSURE

Technical Problem

Therefore, the present invention has been made in view of the above problems, and it is an object of the present invention to provide a nanowire which enables the construction of a low-current-density memory device, by establishing the conditions that allow for the displacement of domain walls even when a low density current is applied to a nanowire formed of a ferromagnetic material.

It is another object of the present invention to provide a memory device including the same nanowire and utilizing the current-induced domain wall displacement.

Technical Solution

In accordance with an aspect of the present invention, the above and other objects can be accomplished by the provision of a nanowire with perpendicular magnetic anisotropy, wherein when a parameter Q reflecting properties of the nanowire (as defined in Equation 3 below) has a value of $3 \times 10^8$ A/cm$^2 \leqq Q \leqq 10^9$ A/cm$^2$, a domain wall thickness λ, a width W and a thickness T of the nanowire satisfy the relationship of $$\frac{1.39}{\sqrt{T/\lambda}} + 4.51 \leq \frac{W}{\lambda} \leq \frac{1.53}{\sqrt{T/\lambda}} + 4.44.$$

In accordance with another aspect of the present invention, there is provided a nanowire with perpendicular magnetic anisotropy, wherein when a parameter Q reflecting properties of the nanowire has a value of $10^8$ A/cm$^2 < Q \leqq 3 \times 10^8$ A/cm$^2$, a domain wall thickness λ, a width W and a thickness T of the nanowire satisfy the relationship of $$\frac{1.27}{\sqrt{T/\lambda}} + 4.55 \leq \frac{W}{\lambda} \leq \frac{1.68}{\sqrt{T/\lambda}} + 4.37.$$

In accordance with a further aspect of the present invention, there is provided a nanowire with perpendicular magnetic anisotropy, wherein when a parameter Q reflecting properties of the nanowire has a value of $3 \times 10^7$ A/cm$^2 < Q \leqq 10^8$ A/cm$^2$, a domain wall thickness λ, a width W and a thickness T of the nanowire satisfy the relationship of $$\frac{0.91}{\sqrt{T/\lambda}} + 4.68 \leq \frac{W}{\lambda} \leq \frac{2.18}{\sqrt{T/\lambda}} + 4.14.$$

In accordance with a still further aspect of the present invention, there is provided a nanowire with perpendicular magnetic anisotropy, wherein when a parameter Q reflecting properties of the nanowire has a value of $10^7$ A/cm$^2 < Q \leqq 3 \times 10^7$ A/cm$^2$, a domain wall thickness λ, a width W and a thickness T of the nanowire satisfy the relationship of $$\frac{0.014}{\sqrt{T/\lambda}} + 4.92 \leq \frac{W}{\lambda} \leq \frac{4.23}{\sqrt{T/\lambda}} + 3.19.$$

In accordance with another aspect of the present invention, there is provided a nanowire with perpendicular magnetic anisotropy, wherein when a parameter Q reflecting properties of the nanowire has a value of $7 \times 10^6$ A/cm$^2 < Q \leqq 10^7$ A/cm$^2$, a domain wall thickness λ, a width W and a thickness T of the nanowire satisfy the relationship of $$\frac{0}{\sqrt{T/\lambda}} + 4.05 \leq \frac{W}{\lambda} \leq \frac{9.89}{\sqrt{T/\lambda}} + 1.22.$$

In accordance with yet another aspect of the present invention, there is provided a nanowire with perpendicular magnetic anisotropy, wherein when a parameter Q reflecting properties of the nanowire has a value of $Q \leqq 7 \times 10^6$ A/cm$^2$, a domain wall thickness λ, a width W and a thickness T of the nanowire satisfy the relationship of $$\frac{W}{\lambda} \leq \frac{13.5}{\sqrt{T/\lambda}} + 0.296.$$

A material for the nanowire may be any one selected from the group consisting of Fe, Co, Ni and any combination thereof. Alternatively, the nanowire may be formed of a rare-earth metal.

Further, the present invention provides a memory device including the aforesaid nanowire and utilizing the current-induced domain wall displacement.

Advantageous Effects

The present invention can be designed such that a current density capable of driving a memory device utilizing the current-driven domain wall displacement has a value of less than $10^7$ A/cm$^2$, through the determination of the optimal nanowire width and thickness satisfying a value of a critical current density, Jc for the domain wall displacement below a certain value required for commercialization, for a given material in the nanowire with perpendicular anisotropy. According to such a configuration of the present invention, the current density required for the domain wall displacement can be at least 10 times or further lowered than the current density in currently available nanowires. Therefore, the present invention is capable of solving the problems associated with high power consumption and malfunction of the device due to generation of Joule heat and is also capable of achieving low-cost production of memory devices.

DESCRIPTION OF DRAWINGS

FIG. 1 shows a conventional ferromagnetic nanowire-based memory device;

FIG. 2 shows a ferromagnetic nanowire-based memory device in accordance with the present invention;

FIG. 3a shows one embodiment of a domain wall being possible in a nanowire whose magnetization direction is perpendicular to the nanowire surface;

FIG. 3b shows a conventional domain wall whose magnetization direction is parallel to the nanowire surface, which corresponds to a counterpart of FIG. 3a;

FIG. 3c shows another embodiment of a domain wall being possible in a nanowire whose magnetization direction is perpendicular to the nanowire surface;

FIG. 3d shows a conventional domain wall whose magnetization direction is parallel to the nanowire surface, which corresponds to a counterpart of FIG. 3c;

FIG. 4a shows changes of a domain wall thickness λ with respect to a perpendicular magnetic anisotropy density $K_u$;

FIG. 4b shows changes of a domain wall anisotropic energy density $K_d$ with respect to a nanowire width W;

FIGS. 5 to 10 are graphs illustrating ranges of T/λ and W/λ satisfying the condition of $J_c^{in} < 10^7$ A/cm² with respect to a range of a parameter Q which is determined by the kinds of nanowire-forming materials;

FIGS. 11a to 11c show contours for a thickness T and a width W of a nanowire which is configured to have a parameter Q of less than $10^7$ A/cm²;

FIG. 12 is a graph illustrating a critical current density $J_c$ vs. nanowire width W relationship for a memory device (IA) whose magnetization direction is parallel to the nanowire surface and a memory device (PA) in accordance with the present invention; and FIGS. 13a and 13b are graphs illustrating a critical current density $J_c$ vs. pinning potential $V_o$ relationship for a memory device (IA) whose magnetization direction is parallel to the nanowire surface and a memory device (PA) in accordance with the present invention.

MODE FOR INVENTION

The present invention is aimed to lower a critical current density for induction of the domain wall displacement using an electric current alone without the application of a magnetic field to a level of less than $10^7$ A/cm². For this purpose, a manner whose magnetization direction is perpendicular to the nanowire surface is employed instead of a conventional manner whose magnetization direction is parallel to the nanowire surface, and a structure of the nanowire is optimized.

As shown in FIG. 2, the present invention employs a scheme whose magnetization direction is perpendicular to the nanowire surface, not a conventional one whose magnetization direction is parallel to the nanowire surface.

FIG. 2 shows a ferromagnetic nanowire-based memory device in accordance with the present invention.

Referring to FIG. 2, magnetization directions of magnetic domains 210,220 whose magnetization directions are different from each other and are perpendicular to the nanowire surface are recorded in a conventional ferromagnetic nanowire 200, and the magnetic domains 210,220 are then motioned by means of a current-induced domain wall displacement phenomenon where positional displacement of domain walls takes place upon application of an electric current to the nanowire.

As can be seen from FIG. 1, the conventional ferromagnetic nanowire 200 has a width (W) of from several to several hundreds of nm and a thickness (T) of from several to several hundreds of nm.

In this connection, the information of the magnetic domains is recorded and reproduced by recording and reproduction devices 230,240,250 positioned adjacent to the nanowire. Advantages of this technique are in that the positions of information recording and reproduction devices are fixed and the positions of information-containing magnetic domains can be electrically moved.

As to the nanowire formed of a ferromagnetic material, the current-induced magnetization behavior is depicted in terms of a motion equation according to Equation 1 below.

$$\frac{\partial M}{\partial t} = -\gamma M \times H_{eff} + \frac{\alpha}{M_s} M \times \frac{\partial M}{\partial t} + T_{st} \quad \text{(Equation 1)}$$

In Equation 1, M represents a magnetization vector, γ represents a gyro magnetic coefficient, $H_{eff}$ represents the total effective magnetic field vector, α represents a Gilbert attenuation coefficient, and $M_s$ represents a saturation magnetization of a ferromagnet.

Meanwhile, a spin torque $T_{st}$ caused by the applied current is calculated according to Equation 2 below.

$$T_{st} = -\frac{b_J}{M_s^2} M \times \left( M \times \frac{\partial M}{\partial x} \right) - \frac{\beta b_J}{M_s} M \times \frac{\partial M}{\partial x} \quad \text{(Equation 2)}$$

In Equation 2, $b_J$ represents $P\mu_B J/eM_s$ wherein P represents a spin polarizability of a ferromagnet and has a value of 0 to 1, $\mu_B (=9.274 \times 10^{-24}$ J/T) represents a Bohr magneton, J represents a current density, $e(=1.6 \times 10^{-19}$ C) represents an electron charge quantity, and $M_s$ represents a saturation magnetization of a ferromagnet.

In Equation 2, the first term is an adiabatic spin torque and the second term is a non-adiabatic spin torque, and a constant β is a relative magnitude of the non-adiabatic spin torque vs. the adiabatic spin torque.

At present, an accurate value is not yet known for the magnitude of constant β.

Meanwhile, a critical current density (Intrinsic $J_c = J_c^{in}$) for the domain wall displacement is given according to Equation 3 below.

$$J_c^{in} = \frac{e\gamma\lambda}{P\mu_B}|K_d| = \frac{e\gamma\lambda M_S^2}{2P\mu_B}|N_d| = Q|N_d| \quad \text{(Equation 3)}$$

In Equation 3, $\gamma(=1.76 \times 10^7 \text{Oe}^{-1} \text{sec}^{-1}$ represents a gyromagnetic ratio, and λ represents a value obtained when the distribution of magnetization components in the nanowire thickness direction around the domain wall is approximated in terms of $M_3 \tan h[(x - X_{dw})/\lambda]$, which corresponds to a domain wall thickness and is determined by magnetic components of a ferromagnet.

In this connection, $X_{dw}$ represents a position of the domain wall center, and λ has a relationship defined by Equation 4 below.

$$\lambda = \sqrt{\frac{A}{K_U - N_\perp M_S^2/2}} \quad \text{(Equation 4)}$$

In Equation 4, A represents an effective exchange constant of a ferromagnet, $K_u$ represents a perpendicular magnetic anisotropic energy density, $N_\perp$ represents a demagnetization factor in the nanowire thickness direction, and $N_d$ represents a domain wall demagnetizing factor corresponding to $K_d$ and is determined by the dipole-dipole interaction of a magnetization vector constituting the domain wall.

Parameter Q, as previously defined in Equation 3, is a quantity determined by components of the nanowire such as $M_s$, P, etc., is a variable that is calculated by a saturation magnetization per unit area, a domain wall thickness and a spin polarizability of a ferromagnet, and has a value of $10^6$ A/cm² < Q < $10^9$ A/cm².

Equation 3 implies that the domain wall is displaced when the magnitude of current-induced spin torque overcomes the anisotropic domain wall energy.

From Equation 3, in order to satisfy the condition that a critical current density $J_c$ for the magnetic field-free current-induced domain wall displacement has a value of less than $10^7$ A/cm² using a scheme of the present invention whose magnetization direction is perpendicular to the nanowire surface, it is required that $N_d$ meets the requirements of Equation 5 below.

$$|N_d| = \frac{J_c^{in}}{Q} < \frac{10^7}{Q} \quad \text{(Equation 5)}$$

In Equation 5, $N_d$ is a domain wall demagnetizing factor and is therefore a physical quantity that is determined upon the determination of a nanowire width W, a nanowire thickness T and a domain wall thickness $\lambda$.

That is, as depicted in Equations 6 and 7, $N_d$ is a function only of T/$\lambda$ and W/$\lambda$.

Then, when the parameter Q is determined with respect to the kinds of magnetic materials, $N_d$ to satisfy the condition that $J_c$ has a value of less than $10^7$ A/cm² due to Equation 5, that is, T/$\lambda$ and W/$\lambda$ correlated to a structure of the nanowire are then determined.

The present invention is directed to an optimum nanowire structure satisfying a value of $J_c^{in} < 10^7$ A/cm² under Equation 5, that is, optimum ranges of T/$\lambda$ and W/$\lambda$, for a given magnetic material.

As described above, when $N_d$ is made to have a value below the critical value by controlling a nanowire width W and a nanowire thickness T in a given material, the critical current density can be set to a value of $10^7$ A/cm² which is the required level for practical commercialization.

Meanwhile, $N_d$ can be calculated according to Equations 6 to 8.

In addition, w disclosed in Equations 6 to 8 corresponds to W disclosed throughout the present invention, and t corresponds to T.

$$N_d = N_{dx} - N_{dy} \quad \text{(Equation 6)}$$

$$N_{dx} = \frac{1}{2S\lambda} \int d^3x \int d^3x' K_{xx}(r-r')\text{sech}(x'/\lambda)\text{sech}(x/\lambda)$$

$$N_{dy} = \frac{1}{2S\lambda} \int d^3x \int d^3x' K_{yy}(r-r')\text{sech}(x'/\lambda)\text{sech}(x/\lambda)$$

As can be seen from Equation 6, $N_d$ is calculated from the difference between $N_{d_x}$ and $N_{d_y}$ and values of $N_{d_x}$ and $N_{d_y}$ are also calculated according to Equation 6.

$$N_{dx} = -\frac{1}{2S\lambda^2} \int dx F(x) \left[ \frac{2x}{\lambda \sinh(x/\lambda)} - \frac{4x \cosh^2(x/\lambda)}{\lambda \sinh^3(x/\lambda)} + \frac{4\cosh(x/\lambda)}{\sinh^2(x/\lambda)} \right] \quad \text{(Equation 7)}$$

$$F(x) = \frac{4}{3}\left[|x|^3 + (x^2+w^2+t^2)^{3/2} - (x^2+w^2)^{3/2} - (x^2+t^2)^{3/2}\right] +$$

$$4wt\left[w\ln\left(\frac{t+\sqrt{x^2+w^2+t^2}}{\sqrt{x^2+w^2}}\right) + t\ln\left(\frac{w+\sqrt{x^2+w^2+t^2}}{\sqrt{x^2+t^2}}\right) - x\tan^{-1}\left(\frac{wt}{x\sqrt{x^2+w^2+t^2}}\right)\right] +$$

$$2\left[t^2\sqrt{x^2+t^2} + w^2\sqrt{x^2+w^2} - t^2\sqrt{x^2+w^2+t^2} - w^2\sqrt{x^2+w^2+t^2}\right] +$$

$$2\left[tx^2\ln\left(\frac{t+\sqrt{x^2+t^2}}{|x|}\right) + wx^2\ln\left(\frac{w+\sqrt{x^2+w^2}}{|x|}\right)\right] -$$

$$2\left[t(x^2+w^2)\ln\left(\frac{t+\sqrt{x^2+w^2+t^2}}{\sqrt{x^2+w^2}}\right) + w(x^2+t^2)\ln\left(\frac{w+\sqrt{x^2+w^2+t^2}}{\sqrt{x^2+t^2}}\right)\right]$$

Meanwhile, a value of $N_{d_x}$ is calculated using a value of F(x). Details for calculation of F(x) are as defined in Equation 7. $N_{d_x}$ in Equation 7 is perfectly determined by T/$\lambda$ and W/$\lambda$, as the integration of x is carried out from $-\infty$ to $+\infty$.

$$N_{dy} = -\frac{1}{2S\lambda} \int dx G(x) \frac{2x}{\sinh(x/\lambda)} \quad \text{(Equation 8)}$$

$$G(x) = 4\left[|x| + \sqrt{x^2+w^2+t^2} - \sqrt{x^2+w^2} - \sqrt{x^2+t^2}\right] +$$

$$4\left[t\ln\left(\frac{t+\sqrt{x^2+t^2}}{|x|}\right) - t\ln\left(\frac{t+\sqrt{x^2+w^2+t^2}}{\sqrt{x^2+w^2}}\right)\right]$$

In addition, a value of $N_{d_y}$ is calculated using a value of G(x). Details for calculation of G(x) are as defined in Equation 8. Similar to $N_{d_x}$ of Equation 7, $N_{d_y}$ of Equation 8 is perfectly determined by T/$\lambda$ and W/$\lambda$, as the integration of x is carried out from $-\infty$ to $+\infty$.

FIGS. 3a and 3c show two types of domain walls being possible in a nanowire whose magnetization direction is perpendicular to the nanowire surface.

In FIGS. 3a and 3c, x-axis represents a length direction of the nanowire, y-axis represents a width direction of the nanowire, and z-axis represents a thickness direction of the nanowire. In FIGS. 3a and 3b, $\lambda$ represents a thickness of the domain wall magnetized in a given direction, and W represents a nanowire width in a given material and T represents a nanowire thickness in a given material.

On the basis of a magnetization direction, the magnetization configuration according to FIG. 3a is referred to as a ZYZ domain wall which is a stable domain wall when the condition of W/$\lambda \gg 1$ is satisfied. The corresponding conventional counterpart nanowire whose magnetization direction is parallel to the nanowire surface is as shown in FIG. 3b.

On the basis of a magnetization direction, the magnetization configuration according to FIG. 3c is referred to as a ZXZ domain wall which is a stable domain wall with the condition of W/$\lambda \ll 1$. The corresponding conventional counterpart nanowire whose magnetization direction is parallel to the nanowire surface is as shown in FIG. 3d.

FIG. 4a shows changes of a domain wall thickness $\lambda$ with respect to a perpendicular magnetic anisotropy density $K_u$, when the nanowire has a thickness T of 10 nm, a width W of 77 nm, a saturation magnetization $M_s$ of 400 emu/cm³, and an effective exchange coefficient A of $1.3 \times 10^{-6}$ erg/cm.

As can be seen from FIG. 4a, it is possible to control a thickness $\lambda$ of the domain wall, by changing a value of $K_u$ at the thickness T and width W of a given nanowire.

FIG. 4b shows changes of a domain wall anisotropic energy density $K_d$ of Equation 3 with respect to a nanowire width W, when the nanowire has a thickness T of 10 nm, a perpendicular magnetic anisotropy density $K_u$ of $1.5 \times 10^6$ erg/cm$^3$, a saturation magnetization $M_s$ of 400 emu/cm$^3$, and an effective exchange coefficient A of $1.3 \times 10^{-6}$ erg/cm.

As can be seen from FIG. 4b, it is possible to establish so that the domain wall anisotropic energy density $K_d$ has a value of 0, by changing a nanowire width W in a nanowire having a given material and structure. In this connection, the point at which the domain wall anisotropic energy density $K_d$ becomes zero is the point at which the ZYZ domain wall and the ZXZ domain wall have the same energy level.

Therefore, through the adjustment of the nanowire thickness T and nanowire width W of a given nanowire material according to Equations 6 to 8, it is possible to design so that the domain wall demagnetizing factor $N_d$ or the domain wall anisotropic energy density $K_d$ approximates to 0. As a result, a critical current density $J_c$ for the domain wall displacement can be lowered to a significantly small value according to Equation 3.

Then, for any magnetic material, a maximum value of the domain wall demagnetizing factor $N_d$ satisfying a value of $J_c^{in} < 10^7$ A/cm$^2$ can be determined according to Equation 5.

When the domain wall demagnetizing factor $N_d$ is determined, optimum ranges of T/λ and W/λ satisfying the thus-determined value of $N_d$ can be determined, and ranges of T/λ and W/λ can be determined according to Equation 9 below.

$$\frac{a_1}{\sqrt{T/\lambda}} + b_1 \leq \frac{W}{\lambda} \leq \frac{a_2}{\sqrt{T/\lambda}} + b_2 \quad \text{(Equation 9)}$$

When the parameter Q is determined by a nanowire-forming material, ranges of T/λ and W/λ satisfying a value of $J_c^{in} < 10^7$ A/cm$^2$ can be determined.

FIG. 5 shows ranges of T/λ and W/λ satisfying the condition of $J_c^{in} < 10^7$ A/cm$^2$ when a parameter Q determined by a constituent material of the nanowire has a value of $3 \times 10^8$ A/cm$^2$ < Q ≤ $10^9$ A/cm$^2$.

In this connection, the ferromagnetic nanowire with perpendicular magnetic anisotropy may be formed of any one selected from the group consisting of Fe, Co, Ni and any combination thereof. Alternatively, Examples of the material for the nanowire may include one or more rare-earth metals.

In FIG. 5, an area between the upper curve 410 and the lower curve 420 corresponds to ranges of T/λ and W/λ satisfying the condition of $J_c^{in} < 10^7$ A/cm$^2$.

When values of $a_1$, $a_2$, $b_1$, $b_2$ in Equation 9 are calculated by matching of Equation 9 with FIG. 5, they are as shown in Equation 10 below. In addition, ranges of T/λ and W/λ satisfying the conditions of $3 \times 10^8$ A/cm$^2$ < Q ≤ $10^9$ A/cm$^2$ and $J_c^{in} < 10^7$ A/cm$^2$ can be determined according to Equation 10.

$$\frac{1.39}{\sqrt{T/\lambda}} + 4.51 \leq \frac{W}{\lambda} \leq \frac{1.53}{\sqrt{T/\lambda}} + 4.44 \quad \text{(Equation 10)}$$

Therefore, when the parameter Q is determined and then T/λ and W/λ of the nanowire are set to within the specified range according to Equation 10, it is possible to design so that a current density capable of driving a memory device taking advantage of the current-driven domain wall displacement has a value of less than $10^7$ A/cm$^2$.

FIG. 6 shows ranges of T/λ and W/λ satisfying the condition of $J_c^{in} < 10^7$ A/cm$^2$ when a parameter Q determined by a constituent material of the nanowire has a value of $10^8$ A/cm$^2$ < Q ≤ $3 \times 10^8$ A/cm$^2$.

In this connection, the ferromagnetic nanowire with perpendicular magnetic anisotropy may be formed of any one selected from the group consisting of Fe, Co, Ni and any combination thereof. Alternatively, examples of the material for the nanowire may include one or more rare-earth metals.

In FIG. 6, an area between the upper curve 510 and the lower curve 520 corresponds to ranges of T/λ and W/λ satisfying the condition of $J_c^{in} > 10^7$ A/cm$^2$.

When values of $a_1$, $a_2$, $b_1$, $b_2$ in Equation 9 are calculated by matching of Equation 9 with FIG. 6, they are as shown in Equation 11 below. In addition, ranges of T/λ and W/λ satisfying the conditions of $10^8$ A/cm$^2$ < Q ≤ $3 \times 10^8$ A/cm$^2$ and $J_c^{in} < 10^7$ A/cm$^2$ can be determined according to Equation 11.

$$\frac{1.27}{\sqrt{T/\lambda}} + 4.55 \leq \frac{W}{\lambda} \leq \frac{1.68}{\sqrt{T/\lambda}} + 4.37 \quad \text{(Equation 11)}$$

Therefore, when the parameter Q is determined and then T/λ and W/λ of the nanowire are set to within the specified range according to Equation 11, it is possible to design so that a current density capable of driving a memory device taking advantage of the current-driven domain wall displacement has a value of less than $10^7$ A/cm$^2$.

FIG. 7 shows ranges of T/λ and W/λ satisfying the condition of $J_c^{in} < 10^7$ A/cm$^2$ when a parameter Q determined by a constituent material of the nanowire has a value of $3 \times 10^7$ A/cm$^2$ < Q ≤ $10^8$ A/cm$^2$.

In this connection, the ferromagnetic nanowire with perpendicular magnetic anisotropy may be formed of any one selected from the group consisting of Fe, Co, Ni and any combination thereof. Alternatively, examples of the material for the nanowire may include one or more rare-earth metals.

In FIG. 7, an area between the upper curve 610 and the lower curve 620 corresponds to ranges T/λ and W/λ satisfying the condition of $J_c^{in} < 10^7$ A/cm$^2$.

When values of $a_1$, $a_2$, $b_1$, $b_2$ in Equation 9 are calculated by matching of Equation 9 with FIG. 7, they are as shown in Equation 12 below. In addition, ranges of T/λ and W/λ satisfying the conditions of $3 \times 10^7$ A/cm$^2$ < Q ≤ $10^8$ A/cm$^2$ and $J_c^{in} < 10^7$ A/cm$^2$ can be determined according to Equation 12.

$$\frac{0.91}{\sqrt{T/\lambda}} + 4.68 \leq \frac{W}{\lambda} \leq \frac{2.18}{\sqrt{T/\lambda}} + 4.14 \quad \text{(Equation 12)}$$

Therefore, when the parameter Q is determined and then T/λ and W/λ of the nanowire are set to within the specified range according to Equation 12, it is possible to design so that a current density capable of driving a memory device taking advantage of the current-driven domain wall displacement has a value of less than $10^7$ A/cm$^2$.

FIG. 8 shows ranges of T/λ and W/λ satisfying the condition of $J_c^{in} < 10^7$ A/cm$^2$ when a parameter Q determined by a constituent material of the nanowire has a value of $10^7$ A/cm$^2$ < Q ≤ $3 \times 10^7$ A/cm$^2$.

In this connection, the ferromagnetic nanowire with perpendicular magnetic anisotropy may be formed of any one selected from the group consisting of Fe, Co, Ni and any combination thereof. Alternatively, the nanowire may also be formed of one or more rare-earth metals.

In FIG. 8, an area between the upper curve 710 and the lower curve 720 corresponds to ranges of T/λ and W/λ satisfying the condition of $J_c^{in} < 10^7$ A/cm$^2$.

When values of $a_1, a_2, b_1, b_2$ in Equation 9 are calculated by matching of Equation 9 with FIG. 8, they are as shown in Equation 13 below. In addition, ranges of $T/\lambda$ and $W/\lambda$ satisfying the conditions of $10^7$ A/cm$^2$<$Q \leq 3 \times 10^7$ A/cm$^2$ and $J_c^{in} < 10^7$ A/cm$^2$ can be determined according to Equation 13.

$$\frac{0.014}{\sqrt{T/\lambda}} + 4.92 \leq \frac{W}{\lambda} \leq \frac{4.23}{\sqrt{T/\lambda}} + 3.19 \quad \text{(Equation 13)}$$

Therefore, when the parameter Q is determined and then $T/\lambda$ and $W/\lambda$ of the nanowire are set to within the specified range according to Equation 13, it is possible to design so that a current density capable of driving a memory device taking advantage of the current-driven domain wall displacement has a value of less than $10^7$ A/cm$^2$.

FIG. 9 shows ranges of $T/\lambda$ and $W/\lambda$ satisfying the condition of $J_c^{in} < 10^7$ A/cm$^2$ when a parameter Q determined by a constituent material of the nanowire has a value of $7 \times 10^6$ A/cm$^2$<$Q \leq 10^7$ A/cm$^2$.

In this connection, the ferromagnetic nanowire with perpendicular magnetic anisotropy may be formed of any one selected from the group consisting of Fe, Co, Ni and any combination thereof. Alternatively, the nanowire may also be formed of one or more rare-earth metals.

In FIG. 9, an area between the upper curve 810 and the lower curve 820 corresponds to ranges of $T/\lambda$ and $W/\lambda$ satisfying the condition of $J_c^{in} < 10^7$ A/cm$^2$.

When values of $a_1, a_2, b_1, b_2$ in Equation 9 are calculated by matching of Equation 9 with FIG. 9, they are as shown in Equation 14 below. In addition, ranges of $T/\lambda$ and $W/\lambda$ satisfying the conditions of $7 \times 10^6$ A/cm$^2$<$Q \leq 10^7$ A/cm$^2$ and $J_c^{in} < 10^7$ A/cm$^2$ can be determined according to Equation 14.

$$\frac{0}{\sqrt{T/\lambda}} + 4.05 \leq \frac{W}{\lambda} \leq \frac{9.89}{\sqrt{T/\lambda}} + 1.22 \quad \text{(Equation 14)}$$

Therefore, when the parameter Q is determined and then $T/\lambda$ and $W/\lambda$ of the nanowire are set to within the specified range according to Equation 14, it is possible to design so that a current density capable of driving a memory device taking advantage of the current-driven domain wall displacement has a value of less than $10^7$ A/cm$^2$.

FIG. 10 shows ranges of $T/\lambda$ and $W/\lambda$ satisfying the condition of $J_c^{in} < 10^7$ A/cm$^2$ when a parameter Q determined by a constituent material of the nanowire has a value of $Q \leq 7 \times 10^6$ A/cm$^2$.

In this connection, the ferromagnetic nanowire with perpendicular magnetic anisotropy may be formed of any one selected from the group consisting of Fe, Co, Ni and any combination thereof. Alternatively, the nanowire may also be formed of one or more rare-earth metals.

In FIG. 10, an area under the curve 910 corresponds to ranges of $T/\lambda$ and $W/\lambda$ satisfying the condition of $J_c^{in} < 10^7$ A/cm$^2$.

When values of $a_1, a_2, b_1, b_2$ in Equation 9 are calculated by matching of Equation 9 with FIG. 10, they are as shown in Equation 15 below. In addition, ranges of $T/\lambda$ and $W/\lambda$ satisfying the conditions of $Q \leq 7 \times 10^6$ A/cm$^2$ and $J_c^{in} < 10^7$ A/cm$^2$ can be determined according to Equation 15.

$$\frac{W}{\lambda} \leq \frac{13.5}{\sqrt{T/\lambda}} + 0.296 \quad \text{(Equation 15)}$$

Therefore, when the parameter Q is determined and then $T/\lambda$ and $W/\lambda$ of the nanowire are set to within the specified range according to Equation 15, it is possible to design so that a current density capable of driving a memory device taking advantage of the current-driven domain wall displacement has a value of less than $10^7$ A/cm$^2$.

The aforesaid method of lowering a domain wall anisotropic energy density $K_d$ through the control of a nanowire thickness T and a nanowire width W in the nanowire made of a ferromagnet is also applicable to a nanowire whose magnetization direction is perpendicular to the nanowire surface.

This is because the domain wall anisotropic energy density $K_d$ becomes zero at the point where the XYX domain wall and the XZX domain wall have the same energy level, as shown in FIGS. 4a and 4b. Therefore, the same basic principle applies to both of the nanowire whose magnetization direction is perpendicular to the nanowire surface and the nanowire whose magnetization direction is parallel to the nanowire surface.

However, upon practical fabrication of the nanowire, it will have the distribution of a critical current density $J_c$ with respect to overall nanowire thickness T and nanowire width W, due to various reasons accompanied by a manufacturing process.

FIGS. 11a to 11c show contours for a thickness T and a width W of a nanowire configured to design so that a current density capable of driving a memory device utilizing the current-driven domain wall displacement has a value of less than $10^7$ A/cm$^2$ with respect to each perpendicular magnetic anisotropy density $K_u$.

Referring to FIGS. 11a to 11c, it can be confirmed that a thickness T and a width W of the nanowire configured to have a memory device-driving current density of less than $10^7$ A/cm$^2$ have different values depending on each perpendicular magnetic anisotropy density $K_u$. When a nanowire is configured with the thickness T and width W of the nanowire conforming to the aforementioned contour, it is possible to design so that a memory device-driving current density has a value of less than $10^7$ A/cm$^2$.

FIG. 12 is a graph illustrating a critical current density $J_c$ vs. nanowire width W relationship for a memory device (IA) 1110 whose magnetization direction is parallel to the nanowire surface and a memory device (PA) 1120 in accordance with the present invention.

Referring to FIG. 12, the conventional memory device (IA) with a magnetization direction parallel to the nanowire surface should be fabricated with the precision of less than 0.1 nm in terms of nanowire width or thickness in order to obtain a value of Jc<$10^6$ A/cm$^2$. However, it is impossible to fabricate such a high-precision device due to the occurrence of many errors accompanied during practical processes.

On the other hand, the memory device (PA) in accordance with the present invention can achieve the condition of Jc<$10^6$ A/cm$^2$, if it is fabricated with the precision of less than 3 nm.

Further, the conventional memory device (IA) with a magnetization direction parallel to the nanowire surface should be fabricated with the precision of less than 1 nm in terms of nanowire width or thickness in order to satisfy the condition of $J_c^{in} < 10^7$ A/cm$^2$. Similarly, it is impossible to fabricate such a high-precision device due to the occurrence of many errors accompanied during practical processes.

On the other hand, the memory device (PA) in accordance with the present invention can satisfy the condition of $J_c^{in} < 10^7$ A/cm$^2$, if it is fabricated with the precision of less than 27 nm.

In the graph of FIG. 12, the spin polarizability P is 0.7, the saturation magnetization per unit area M$_s$ is 400 emu/cm$^3$, the perpendicular magnetic anisotropy density K$_u$ is 1.5×10$^6$ erg/cm$^3$, the effective exchange coefficient A is 1.3×10$^{-6}$ erg/cm$^3$, and the nanowire thickness T is 10 nm.

In this connection, a thickness λ of the thus-formed domain wall is 13 nm, and then the parameter Q, which is calculated by a saturation magnetization per unit area, a domain wall thickness and a spin polarizability of a ferromagnet, has a value of about 8.9×10$^7$ A/cm$^2$.

In this case, the ferromagnet falls within the specified range of FIG. 7 which was previously defined by Equation 12. When this value is assigned to Equation 12, the critical current density $J_c$ satisfies a range of $J_c^{in} < 10^7$ A/cm$^2$ which is sought by the present invention, for all the values of the nanowire width W within the range of 73.5803 nm<W<85.1894 nm.

Referring to FIG. 12, a range of the nanowire width W satisfying the condition of $J_c^{in} < 10^7$ A/cm$^2$ is 67 nm<W<95 nm. This range encompasses a range of the nanowire width calculated by the parameter Q of 8.9×10$^7$ A/cm$^2$. From these results, it is validated for a range of the nanowire width W depicted by Equation 12 of the present invention.

The reason why the memory device (PA) in accordance with the present invention has a low critical current density at a much broader nanowire width or thickness is because the domain wall anisotropic energy density K$_d$ is relatively significantly less sensitive to a width or thickness of the nanowire in the memory device (PA) of the present invention, as compared to the conventional memory device (IA) which was fabricated with a magnetization direction parallel to the nanowire surface.

Due to process and material heterogeneities upon practical fabrication of the nanowire, there may be a variety of pinning potentials for the domain wall displacement.

Further, as described above, the present invention is required to satisfy the characteristics that the critical current density is not sensitive to a value of β of Equations 1 and 2 and a Gilbert damping constant α determining energy loss of domain walls upon the displacement of domain walls.

FIGS. 13a and 13b are graphs illustrating a critical current density $J_c$ vs. pinning potential V$_O$ relationship for a memory device (IA) whose magnetization direction is parallel to the nanowire surface and a memory device (PA) in accordance with the present invention.

Referring to FIGS. 13a and 13b, a critical current density $J_c$ vs. pinning potential V$_o$ relationship is shown with respect to α and β values.

Regarding FIG. 13a, in the conventional memory device 1210 with a magnetization direction parallel to the nanowire surface, the critical current density $J_c$ is highly sensitive to the pinning potential, α and β, when a value of α is 0.1. As the critical current density $J_c$ exhibits a critical current density value of more than 10$^8$ A/cm$^2$ at a practical pinning potential value V$_o$ of 10$^5$ erg/cm$^3$, practical application thereof is not feasible.

On the other hand, when a thickness T of the nanowire is 10 nm and a width W of the nanowire is 81 nm, the memory device 1220 in accordance with the present invention exhibits a critical current density of 10$^6$~10$^7$ A/cm$^2$ at a practical pinning potential value of 10$^5$ erg/cm$^3$, thus representing superior critical current density properties, i.e. a 10 to 100 times lower critical current density value than the conventional memory device.

Regarding FIG. 13b, in the conventional memory device 1210 with a magnetization direction parallel to the nanowire surface, the critical current density $J_c$ exhibits a critical current density value of 10$^9$ A/cm$^2$ at a practical pinning potential value V$_o$ of 10$^5$ erg/cm$^3$, when a value of α is 0.01. Therefore, the conventional memory device 1210 lacks commercial viability.

On the other hand, when a thickness T of the nanowire is 10 nm and a width W of the nanowire is 81 nm, the memory device 1220 in accordance with the present invention exhibits a critical current density of 10$^6$~10$^7$ A/cm$^2$ at a practical pinning potential value of 10$^5$ erg/cm$^3$, thus representing superior critical current density properties, i.e. a 100 to 1000 times lower critical current density value than the conventional memory device.

Referring to FIGS. 13a and 13b, it can be seen that the critical current density $J_c$ is more susceptible to the pinning potential, α and β, in conjunction with a higher critical current density value of more than 10$^7$ A/cm$^2$ at a practical pinning potential value of 10$^5$ erg/cm$^3$ in the conventional memory device 1210 with the surface-parallel magnetization direction than in the memory device 1220 of the present invention with the perpendicular magnetization direction, thus confirming that the memory device in accordance with the present invention exhibits superior properties in terms of critical current density value.

Industrial Applicability

As apparent from the above description, the present invention can be designed such that a current density capable of driving a memory device utilizing the current-driven domain wall displacement has a value of less than 10$^7$ A/cm$^2$, through the determination of the optimal nanowire width and thickness satisfying a value of a critical current density (Jc) for the domain wall displacement below a certain value required for commercialization, for a given material in the nanowire with perpendicular anisotropy. According to such a configuration of the present invention, an at least 10 times lower or still smaller value is obtained than a current density required for the domain wall displacement in currently commercially available nanowires. Therefore, the present invention is capable of solving the problems associated with high power consumption and malfunction of the device due to generation of Joule heat and is also capable of achieving low-cost production of memory devices.

Although the present invention has been described herein with reference to the foregoing embodiments and the accompanying drawings, those embodiments are provided for illustrative purposes only. Accordingly, those skilled in the art will appreciate that various substitutions, modifications and changes are possible, without departing from the technical spirit of the present invention as disclosed in the accompanying claims. It is to be understood that such substitutions, modifications and changes are within the scope of the present invention. Therefore, the scope of the present invention should be defined by attached claims only.

The invention claimed is:

1. A nanowire with perpendicular magnetic anisotropy, wherein when a parameter Q, calculated by a saturation magnetization per unit area, a domain wall thickness and a spin polarizability of a ferromagnet that is a constituent material of the nanowire, has a value of 3×10$^8$ A/cm$^2$ ≦ Q ≦ 10$^9$ A/cm$^2$, a domain wall thickness λ, a width W and a thickness T of the nanowire satisfy the relationship of Equation 10, (wherein, 0<λ≦4), the parameter Q and a domain wall demagnetizing factor $N_d$ meets the requirement $|N_d| \times J_c^{in}{}_{/Q} \leq 10^7{}_{/Q\ (Jc}{}^{in}$ is a critical current density for the magnetic field-free current-induced domain wall displacement has a value of less than $10^7$ A/cm$^2$), the $N_d$ is a physical quantity that is determined upon the determination of a nanowire width W, and nanowire thickness T and a domain wall thickness $\lambda$, $$\frac{1.39}{\sqrt{T/\lambda}} + 4.51 \leq \frac{W}{\lambda} \leq \frac{1.53}{\sqrt{T/\lambda}} + 4.44. \quad \text{(Equation 10)}$$

2. The nanowire according to claim 1, wherein the nanowire is formed of any one selected from the group consisting of Fe, Co, Ni and any combination thereof.

3. The nanowire according to claim 1, wherein the nanowire is formed of a rare-earth metal.

4. A memory device comprising the nanowire of any one of claims 1 to 3 and utilizing the current-induced domain wall displacement.

* * * * *

UNITED STATES PATENT AND TRADEMARK OFFICE
CERTIFICATE OF CORRECTION

PATENT NO. : 8,300,445 B2
APPLICATION NO. : 12/746473
DATED : October 30, 2012
INVENTOR(S) : Lee et al.

Page 1 of 1

It is certified that error appears in the above-identified patent and that said Letters Patent is hereby corrected as shown below:

In the Claims:

Column 14,

Line 64, in the equation, "≦" should read -- < --;

Line 67, in the equation, "0</λ≧4" should read -- 0<T/λ≦4 --.

Column 15,

Line 1, in the equation, "≦" should read -- < --.

Signed and Sealed this
Fourteenth Day of May, 2013

Teresa Stanek Rea
*Acting Director of the United States Patent and Trademark Office*